US007552533B2

(12) United States Patent
Fartash

(10) Patent No.: US 7,552,533 B2
(45) Date of Patent: Jun. 30, 2009

(54) METHOD OF MANUFACTURING A FLUID EJECTOR HEAD

(75) Inventor: Arjang Fartash, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 390 days.

(21) Appl. No.: 11/190,137

(22) Filed: Jul. 25, 2005

(65) Prior Publication Data

US 2005/0253902 A1 Nov. 17, 2005

Related U.S. Application Data

(62) Division of application No. 10/159,363, filed on May 31, 2002, now Pat. No. 6,942,318.

(51) Int. Cl.
*B21D 53/76* (2006.01)
*C23C 14/34* (2006.01)

(52) U.S. Cl. ............. 29/890.1; 204/192.1; 427/255.395

(58) Field of Classification Search ................ 29/890.1, 29/611, 25.35, 830, 841; 347/44, 47, 50, 347/56, 65; 427/250, 255.395; 204/192.1
See application file for complete search history.

(56) References Cited

U.S. PATENT DOCUMENTS 4,643,948 A 2/1987 Diaz et al.
4,824,697 A * 4/1989 Ishihara et al. .... 427/255.395 X
5,119,116 A 6/1992 Yu
5,841,452 A * 11/1998 Silverbrook ................. 347/47
5,985,759 A 11/1999 Kim et al.
6,121,134 A 9/2000 Burton et al.
6,316,360 B1 11/2001 Burton et al.
6,380,625 B2 4/2002 Pramanick et al.
6,390,609 B1 5/2002 Shigemura et al.

(Continued)

FOREIGN PATENT DOCUMENTS

JP 01294049 A * 11/1989 ............ 29/890.1 X
JP 09216359 8/1997

OTHER PUBLICATIONS

'Plasma-enhanced atomic layer deposition of Ta andTi for interconnect diffusion barriers' by S.M. Rossnagel IBM Research Yorktown Heights, N.Y.from 2000 American Vacuum Society (J.Vac.Sci Technol. B 18(4), Jul.Aug. 2000 pp. 2016-2020.

(Continued)

*Primary Examiner*—A. Dexter Tugbang

(57) ABSTRACT

A fluid ejector head is manufactured. Sidewalls of at least one fluid ejection chamber are defined about at least one fluid drop generator disposed over a substrate. At least one bore is created over the at least one fluid ejection chamber. The at least one bore has a first nozzle surface proximate to the at least one fluid ejection chamber, and a second nozzle surface distal to the at least one fluid ejection chamber. An initial deposit of a protective layer material is deposited at a low substrate bias voltage through the at least one bore. A portion of the initial deposit of the protective layer material is redistributed on the sidewalls at a high substrate bias voltage. An inorganic protective layer is formed on the sidewalls of the at least one fluid ejection chamber and on a portion of the first nozzle surface.

7 Claims, 8 Drawing Sheets

U.S. PATENT DOCUMENTS

| | | | | |
|---|---|---|---|---|
| 6,641,254 | B1 | 11/2003 | Boucher et al. | 347/50 |
| 6,737,109 | B2 | 5/2004 | Stanton et al. | 427/235 |
| 2002/0047152 | A1 | 4/2002 | Yamamoto et al. | |

OTHER PUBLICATIONS

'Metal ion deposition from ionized mangetron sputtering discharge' by S.M. Rossnagel IBM Research Yorktown Heights, N.Y. from 1994 American Vacuum Society (J. Vac Sci. Technol. B12(1), Jan./Feb. 1994 pp. 449-453.

'Simulations of trench-filling profiles under ionized magnetron sputter metal deposition' by S. Hamaguchi and S.M. Rossnagel, IBMThomas J. Watson Research Center, Yorktown Heights, N.Y. 10598 from American Vacuum Society (J. Vac Sci. Technol. B 13(2) Mar./Apr. 1995 pp. 183-191.

'Liner confromality in ionized magetron sputter metal deposition processes' by S. Hamaguchia) and S.M. Rossnagel b), IBMThomas J. Watson Research Center, Yorktown Heights, NewYork 10598 from 1996 American Vacuum Society (J. Vac Sci. Technol. B 14(4) Jul./Aug 1996 pp. 2603-2608.

'Ionized Magnetron Sputtering for Lining and Filling Trenches and Vias' by S.M. Rossnagel IBM Research Yorktown Heights, N.Y. from "Semiconductor International" Feb. 1996 pp. 99-102.

* cited by examiner

METHOD OF MANUFACTURING A FLUID EJECTOR HEAD

RELATED PATENT APPLICATIONS

The present patent application is a divisional patent application of the patent application entitled "Chamber Having A Protective Layer," filed on May 31, 2002, and assigned application Ser. No. 10/159,363, which issued as U.S. Pat. No. 6,942,318 on Sep. 13, 2005. The present patent application claims priority to this earlier patent application under 35 USC 120.

BACKGROUND

Description of the Art

Fluid ejection cartridges typically include a fluid reservoir that is fluidically coupled to a substrate. The substrate normally contains an energy-generating element that generates the force necessary for ejecting the fluid through one or more nozzles. Two widely used energy-generating elements are thermal resistors and piezoelectric elements. The former rapidly heats a component in the fluid above its boiling point creating a bubble causing ejection of a drop of the fluid. The latter utilizes a voltage pulse to move a membrane that displaces the fluid resulting in ejection of a drop of the fluid.

Currently there is a wide variety of highly-efficient inkjet printing systems in use. These systems are capable of dispensing ink in a rapid and accurate manner. However, there is also a demand by consumers for ever-increasing improvements in reliability and image quality, while providing systems at lower cost to the consumer. In an effort to reduce the cost and size of ink jet printers, and to reduce the cost per printed page, printers have been developed having small moving printheads that are typically connected to larger stationary ink supplies. This development is called "off-axis" printing, and has allowed the larger ink supplies, "ink cartridges," to be replaced as it is consumed without requiring the frequent replacement of the costly printhead, containing the fluid ejectors and nozzle system.

Improvements in image quality have typically led to an increase in the organic content of inkjet inks. This increase in organic content typically leads to inks exhibiting a more corrosive nature, potentially resulting in the degradation of the materials coming into contact with such inks. Degradation of these materials by more corrosive inks raises reliability and material compatibility issues. These material compatibility issues generally relate to all the materials the ink comes in contact with. However, they are exacerbated in the printhead because, in an off-axis system, the materials around the fluid ejectors and nozzles need to maintain their functionality over a longer period of time, in order to attain the increased reliability necessary to continue proper functioning through at least several replacements of the ink cartridges. Thus, degradation of these materials can lead to potentially catastrophic failures of the printhead.

For example, in many printheads the layer forming a fluidic chamber around a fluid ejector is a polymeric material, which may contain low molecular weight additives, such as plasticizers, tackifiers, polymerization catalysts, and curing agents. The interaction of these low molecular weight additives and the components of the ink may give rise to a weakening of the substrate/polymer film interface. Delamination of the polymer film from the substrate surface may lead to ink penetrating to regions where active circuitry is located leading to the potential for either corrosion or electrical shorting, or both, all of which can be potentially fatal to the operation of the printhead. In addition, because these additives are low in molecular weight, compared to the polymer molecular weight, they can both be leached out of the polymer layer by the ink, or react with ink components, resulting in changes to the ink properties or the polymer material properties. In either case, whether the low molecular weight material reacts with, or is leached out by the ink, these changes can lead to the formation of precipitates or gelatinous materials, which can further result in changes in the firing characteristics or clogging of nozzles. In addition, in a high humidity or moisture environment the retention of the chemical and physical properties of such polymeric material can also be a problem. All of these problems can impact the manufacture of lower cost, smaller, and more reliable printers.

SUMMARY OF THE INVENTION

A chamber includes a substrate, a chamber layer disposed on the substrate that defines the sidewalls of the chamber, and the chamber layer has a chamber surface. The chamber has an area in the plane formed by the chamber surface in the range from about 1 square micrometer to about 10,000 square micrometers. The chamber also includes an orifice layer disposed over the chamber layer. The orifice layer has a first and second orifice surface and a bore wherein the bore has an area in the plane formed by the first orifice surface less than the chamber area. The chamber further includes a protective layer deposited, through the bore, on the sidewalls of the chamber layer and a portion of the first orifice surface.

DETAILED DESCRIPTION OF THE INVENTION

Figure 1A:
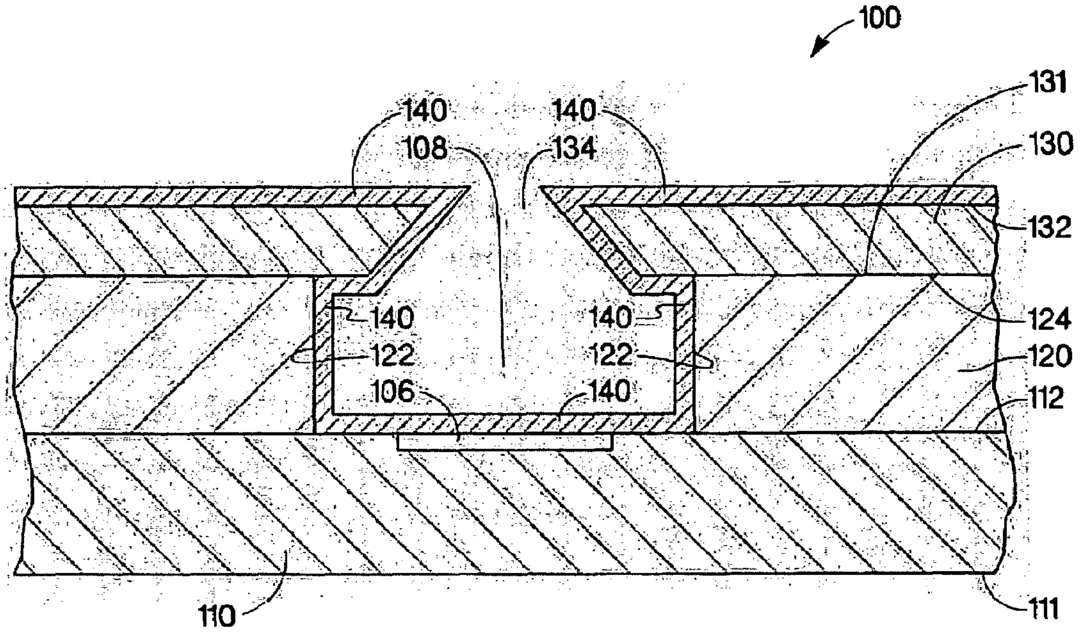
FIG. 1*a* is a cross-sectional view of a fluid ejector head according to an embodiment of the present invention.

Referring to FIG. 1*a*, an embodiment of the present invention is shown in a simplified cross-sectional view. In this embodiment, fluid ejector head 100 includes protective layer 140 providing moisture and corrosion protection to surrounding areas from fluid contained within fluid ejection chamber 108. In this embodiment, substrate 110 is a silicon wafer having a thickness of about 300-700 micrometers. In alternative embodiments, other materials may also be utilized for substrate 110, such as, various glasses, aluminum oxide, polyimide substrates, silicon carbide, and gallium arsenide. Accordingly, the present invention is not intended to be limited to those devices fabricated in silicon semiconductor materials.

Fluid ejector generator 106 is formed on substrate 110. In this embodiment, fluid ejector generator 106 is a thermal resistor. In alternate embodiments, other fluid ejector generators such as piezoelectric, ultrasonic, or electrostatic generators may also be utilized. In this embodiment, substrate 110 also includes one or more transistors (not shown) electrically coupled to fluid ejector generator 106. In alternate embodiments, other active devices such as diodes or memory logic cells may also be utilized, either separately or in combination with the one or more transistors. In still other embodiments, what is commonly referred to as a "direct drive" fluid ejector head, where substrate 110 may include fluid ejector generators without active devices, may also be utilized. The particular combination of active devices and fluid ejector generators will depend on the particular application fluid ejector head is used in as well as the particular fluid being ejected.

It should be noted that the drawings are not true to scale. Certain dimensions have been exaggerated in relation to other dimensions in order to provide a clearer illustration and understanding of the present invention. In addition, for clarity not all lines are shown in each cross-sectional view such as the lines going across the bores of the nozzle layer. In addition, although the embodiments illustrated herein are shown in two-dimensional views with various regions having depth and width, it should be understood that these regions are illustrations of only a portion of a device that is actually a three-dimensional structure. Accordingly, these regions will have three dimensions, including, length, width and depth, when fabricated on an actual device.

Chamber layer 120 is disposed over substrate 110 wherein sidewalls 122 define or form a portion of fluid ejection chamber 108. Nozzle or orifice layer 130 is disposed over chamber layer 120 and contains one or more bores or nozzles 134 through which fluid is ejected. In addition, nozzle layer 130 contains first nozzle surface 131 disposed on chamber layer surface 124, and a second nozzle surface 132. Bore 134 extends from first nozzle surface 131 to second nozzle surface 132. In alternate embodiments, depending on the particular materials utilized for chamber layer 120 and nozzle layer 130 an adhesive layer may also be utilized to adhere nozzle layer 130 to chamber layer 120. Fluid ejection chamber 108 is formed by sidewalls 122, first nozzle surface 131, and substrate surface 112. In this embodiment, the bore diameter at second nozzle surface is in the range from about 2 micrometers to about 50 micrometers. In particular nozzle bore diameters in a range from about 5 micrometers to about 35 micrometers and more particularly in a range from about 15 micrometers to about 30 micrometers can be utilized. Nozzle layer 130 has a thickness in the range from about 1 micrometer to about 50 micrometers.

Protective layer 140 coats sidewalls 122, a portion of substrate surface 112, a portion of first nozzle surface 131, the surface of bore 134 and second nozzle surface 132. In this embodiment, protective layer 140 has a thickness in the range from about 0.01 micrometers to about 1.5 micrometers and is representative of an average thickness. The thickness on the various surfaces may vary depending, for example, on chamber geometry, chamber size, bore size, and nozzle layer thickness as well as on the particular deposition parameters used. In alternate embodiments, protective layer 140 may not coat all of these surfaces depending on the particular chamber and nozzle layers utilized, in fluid ejector head 100, as well as the particular application in which fluid ejector 100 is utilized. In addition, the thickness of protective layer 140 may also vary depending on the particular chamber, and nozzle layers utilized in fluid ejector head 100, as well as the particular application in which fluid ejector 100 is utilized. For example, the thickness of protective layer 140 deposited on substrate surface 112 may be thinner than protective layer 140 deposited on sidewalls 122.

In this embodiment, chamber layer 120 is a photoimagable film that utilizes conventional photolithography equipment to form chamber layer 120 on substrate 110 and then define and develop fluid ejection chamber 108. Chamber layer 120 has a thickness in the range from about 1 micrometers to about 100 micrometers. Nozzle layer 130 may be formed of metal, polymer, glass, or other suitable material such as ceramic. In this embodiment, nozzle layer 130 is a polyimide film. Examples of commercially available nozzle layer materials include a polyimide film available from E. I. DuPont de Nemours & Co. under the trademark "Kapton", a polyimide material available from Ube Industries, LTD (of Japan) under the trademark "Upilex." In an alternate embodiment, the nozzle layer 130 is formed from a metal such as a nickel base enclosed by a thin gold, palladium, tantalum, or rhodium layer. In other alternative embodiments, nozzle layer 130 may be formed from polymers such as polyester, polyethylene naphthalate (PEN), epoxy, or polycarbonate.

Protective layer 140 may be formed of metals, or ceramic materials such as oxides, nitrides, carbides, borides, and mixtures thereof. In this embodiment, protective layer 140 is a metal film. Examples of metals that may be utilized are tantalum, tungsten, molybdenum, titanium, gold, rhodium, palladium, platinum, niobium, nickel or combinations thereof. In other alternative embodiments, protective layer 140 may be formed from silicon nitride, silicon carbide, tungsten carbide, titanium nitride, and molybdenum boride to name a few.

Figure 1B:
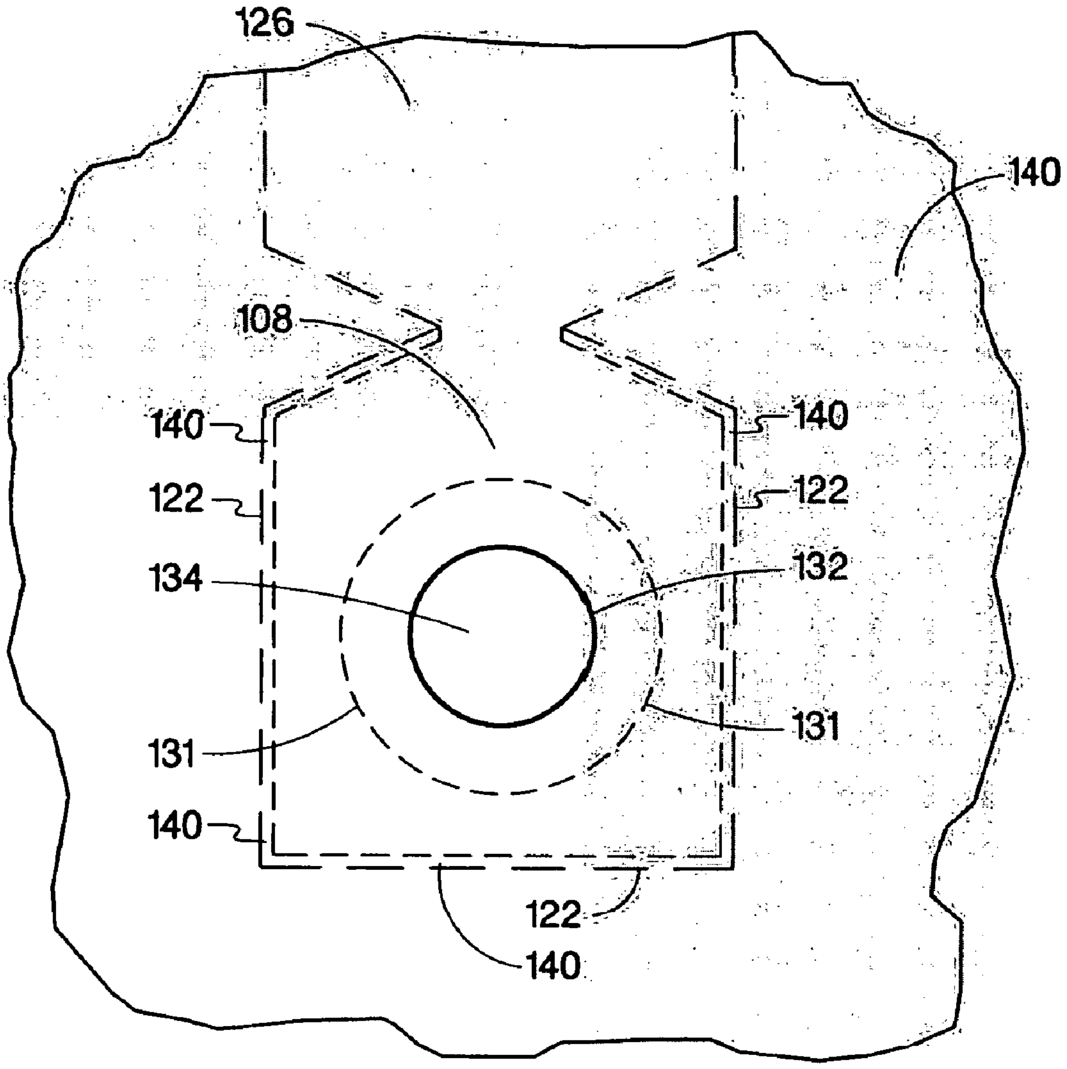
FIG. 1*b* is a top-view of the fluid ejector head shown in FIG. 1*a* according to an embodiment of the present invention.

A top view of the embodiment shown in FIG. 1*a* is shown in FIG. 1*b*. In this embodiment, fluid ejection chamber 108 is substantially square, however, other structures such as rectangular, oval, or circular may also be utilized in alternate embodiments. In this embodiment, fluid ejection chamber 108 has a thickness or height that can range from about 1 micrometer to about 100 micrometers. In particular the thickness may range from about 2 to about 35 micrometers and more particularly from about 5 micrometers to about 25 micrometers. Other shapes and dimensions may be utilized depending on the particular application and fluid being ejected from fluid ejection chamber 108. In addition, for clarity only a portion of one or more fluidic channels 126 have been shown in FIG. 1*b*. In this embodiment, fluid channels formed in chamber layer 120 provide a fluid path from the edge of substrate 110 to fluid ejection chamber 108, which is commonly referred to as an "edgefeed" fluid ejector head. In an alternate embodiment, the portion of nozzle layer 130 situated over or above the fluid channel also contains orifices, through which the channel surfaces may be coated with protective layer 140. In still another alternate embodiment, fluid channels may be formed through substrate 110 for each fluid ejector generator 106 providing fluid channels from substrate bottom 111 to substrate surface 112. In still other embodiments, a slot is formed in substrate 110 from substrate bottom 111 to substrate surface 112 providing fluid to multiple fluid ejector generators 106.

As noted above bore 134 extends from first nozzle surface 131 to second nozzle surface 132. In this embodiment, the area of bore 134 at first nozzle surface 131 is smaller than the area of fluid ejection chamber 108 defined at chamber layer surface 124 shown in FIG. 1*a*. In addition, typically the area of bore 134 at first nozzle surface 131 is greater than the area of bore 134 at second nozzle surface 132.

In alternate embodiments, other bore wall structures such as straight bores, bores with concave walls, or bores with substantially an hour-glass shape may also be utilized, depending on the particular material used for nozzle layer 130, as well as the particular application in which fluid ejector head 100 is used. Further, in alternate embodiments, these bore wall structures may also be combined with other bore shapes. In addition, other wall structures such as concave or convex can also be utilized for sidewalls 122 of chamber layer 120. Fluid ejector head 100 described in the present invention can reproducibly and reliably eject drops in the range of from about one femtoliter to about ten nanoliters depending on the parameters and structures of the fluid ejector head such as the size and geometry of the chamber around the fluid ejector, the size and geometry of the fluid ejector, and the size and geometry of the nozzle.

Although FIGS. 1*a*-1*b* refer to a fluid ejector head, in an alternate embodiment, fluid ejector generator 106 may be omitted and fluid ejection chamber 108 provides, for example, a chamber that may be utilized for mixing, carrying out a reaction or other applications such as in a micro-electromechanical device or a lab on a chip device. In this alternate embodiment, the chamber has an area in the plane formed by chamber layer surface 124 in the range from about 1 square micrometer to about 10,000 square micrometers. In particular chambers having an area in the range from about 1 to about 2500 square micrometers and more particularly from about 1 to about 1000 square micrometers can be utilized. The chamber and orifice layers as well as the substrate and the protective layer may be made from those materials described above for the fluid ejector head and may contain similar structures as described above. In still another embodiment the chamber may include one or more fluidic channels fluidically coupled to the chamber. The fluidic channels include orifices appropriately spaced through which the channel surfaces may be coated with the protective layer. The particular spacing depends, for example, on the dimensions of the fluidic channel and on the size of the orifices or bores as well as on the thickness of the orifice layer. Depending on the particular application in which the chamber will be used the chamber and fluid channel orifices may be closed using an appropriate material after deposition of the protective layer is complete. The particular material utilized will depend, for example, on the orifice layer material and on the particular application in which the chamber will be used.

Figure 2A:
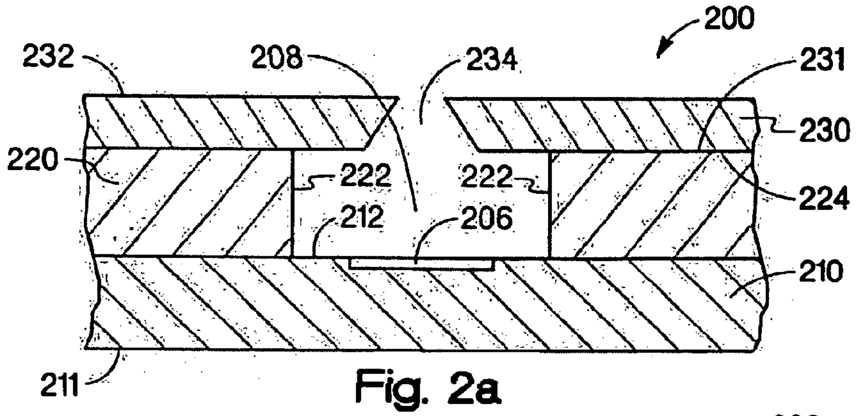
FIG. 2*a* is a cross-sectional view of a fluid ejector head according to an embodiment of the present invention.

Referring to FIGS. 2*a*-2*d* the creation of protective layer 240 is illustrated in simplified cross-sectional views. For clarity protective layer 240 is denoted as 240' while the layer is being created and modified. FIG. 2*a* is a simplified cross-sectional view of fluid ejector head 200 prior to creation of the protective layer. Substrate 210 includes fluid ejector generator 206. Chamber layer 220 is disposed over substrate 210 wherein sidewalls 222 define a portion of fluid ejection chamber 208. Nozzle layer 230 is disposed over chamber layer surface 224 and contains one or more bores or nozzles 234 through which fluid is ejected.

Either fluid ejector head 200 or a wafer containing multiple fluid ejector heads is loaded into a conventional semiconductor thin film sputtering deposition system set up to perform ionized physical vapor deposition (PVD). For example, an integrated system with a self-ionized plasma manufactured by Applied Materials Corporation and sold under the name Endura or an ionized PVD deposition tool manufactured by Trikon Technologies Inc. and sold under the name Sigma® fxP™ can be utilized.

In this sputtering deposition process a significant fraction of the sputtered particles from the sputtering target are ionized in the plasma. The ionized physical deposition chamber consists of an apparatus to support either fluid ejector head 200 or a wafer containing multiple fluid ejector heads to be coated and a target, such as a tantalum plate. The pedestal may have an RF power bias source, the deposition chamber may include an RF power source, or static or time-dependent magnetic field lines coupled with the plasma to increase the density of ionized particles in the plasma that are sputtered off from the target, and the target may have an RF or a DC power source. Such an ionized plasma can be produced by a variety of methods. Another technique commonly referred to as "long throw" sputtering may also be utilized.

Figure 2B:
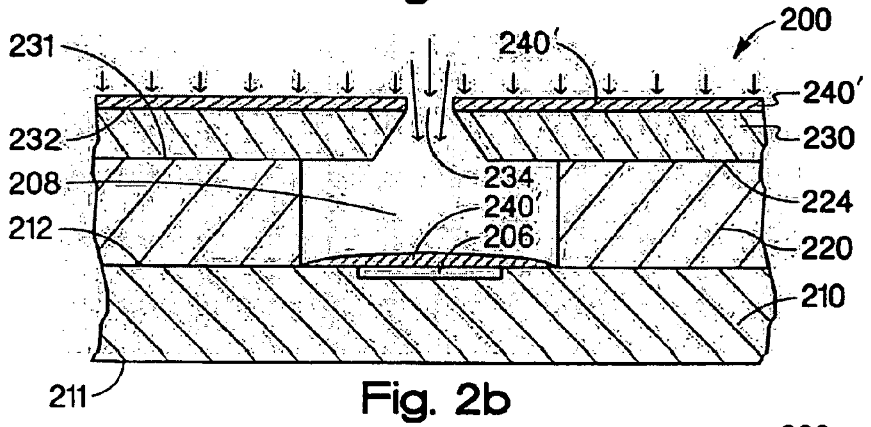
FIG. 2*b* is a cross-sectional view of a fluid ejector head according to an embodiment of the present invention.

In FIG. 2*b* a low substrate bias power is applied either to fluid ejector head 200 or the wafer during sputtering, creating a deposit of the sputtering target material on second nozzle surface 232 and on a portion of substrate surface 212 within fluid ejection chamber 208, thus creating the initial deposit of protective layer 240'. In this embodiment, the sputtering target material is tantalum, however, as previously described above, a wide range of target materials can be utilized depending on the particular materials utilized for chamber layer 220 and nozzle layer 230, as well as the application in which fluid ejector head 200 will be used.

Figure 2C:
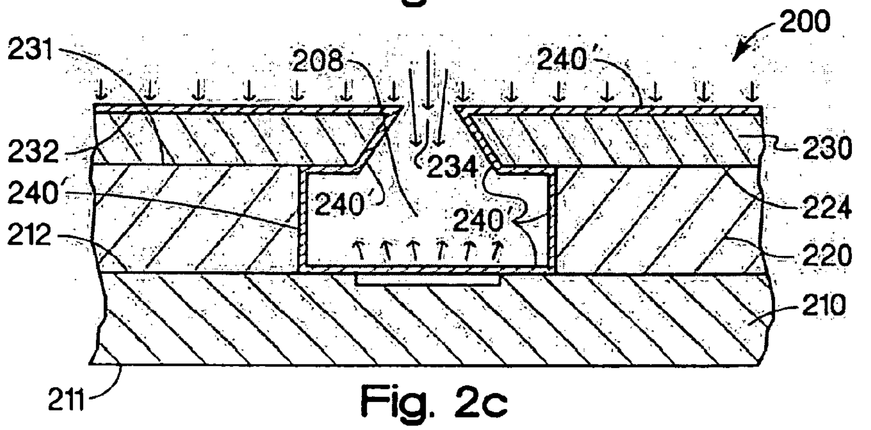
FIG. 2*c* is a cross-sectional view of a fluid ejector head according to an embodiment of the present invention.

In FIG. 2*c* a high substrate bias power is used to sputter off on impact the material of protective layer 240'. The material of protective layer 240' shown in FIG. 2*b* is depleted because it is sputtered off onto sidewalls 222. In addition, material is also deposited on the portion of first nozzle surface 231 that is within fluid ejection chamber 208, and it is deposited within bore 234.

Figure 2D:
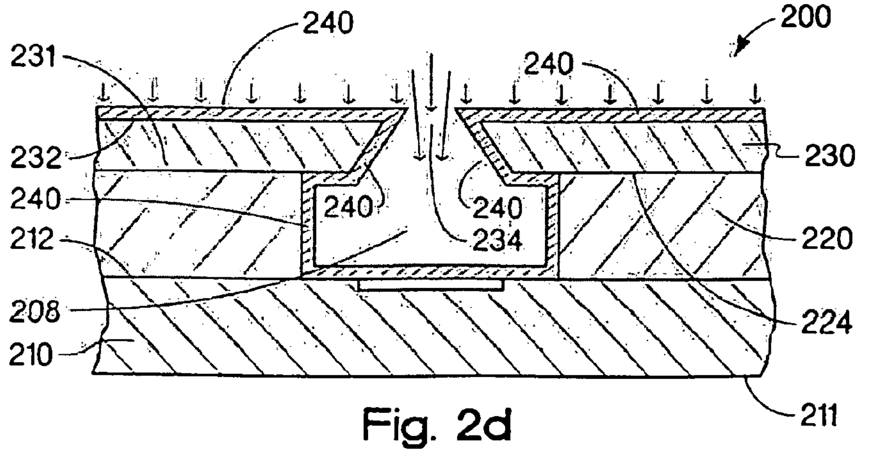
FIG. 2*d* is a cross-sectional view of a fluid ejector head according to an embodiment of the present invention.
Figure 3:
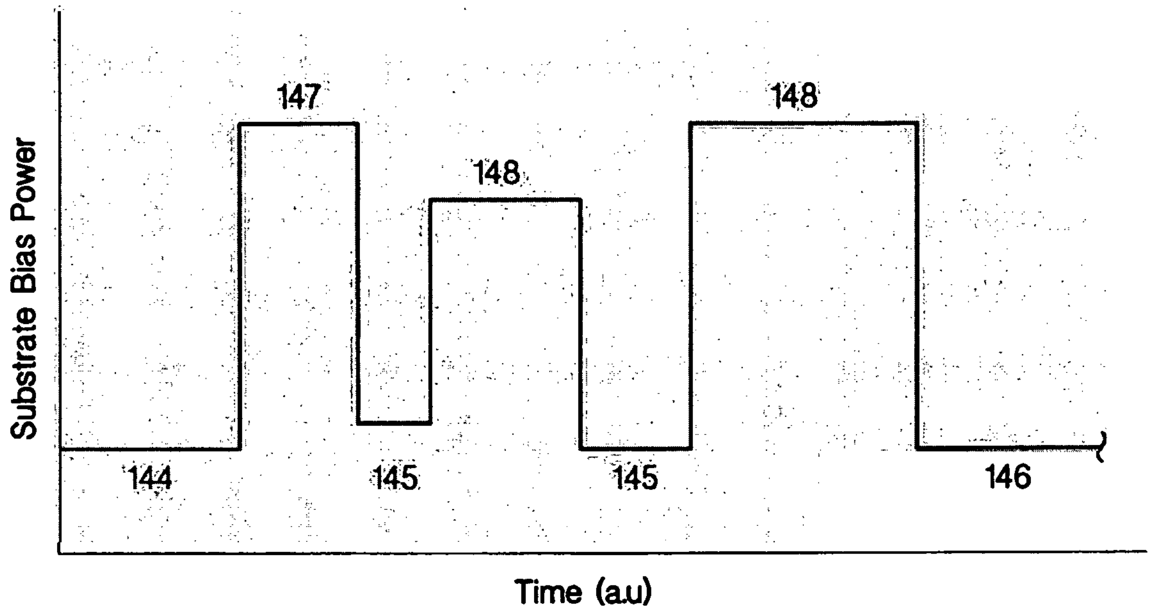
FIG. 3 is a timing diagram of substrate bias voltage according to an embodiment of this invention.

In FIG. 2*d* a low substrate bias interval is used to replenish the protective layer material previously removed from substrate surface described above in FIG. 2*c*. This process can be repeated or combined in different sequences to create an optimized thickness and topography for a particular application as shown in FIG. 3. FIG. 3 shows an idealized timing diagram of substrate bias power as a function of time illustrating that the time and the bias power can be controlled independently. In FIG. 3, low substrate bias power 144 period represents the time in which a low substrate bias is applied to the substrate to form the initial deposit. High substrate bias power period 147 represents a cycle whereby material is redistributed on the sidewalls and other structures depending on the particular application. Low substrate bias power periods 145 represent cycles of deposition that may be the same or different in both time and applied power compared to low substrate bias power period 144. High substrate bias power periods 148 represent cycles whereby material is redistributed within the fluid ejection chamber and bore. High substrate bias power periods 148 may be the same or different in both time and applied power compared to high substrate bias power period 147. Typically the process ends with low substrate bias power period 146 resulting in deposition of material on the substrate and on the nozzle layer.

In alternate embodiments, different sputtering targets may also be utilized during different cycles to create a multilayer protective layer or to deposit a different material on the sidewalls than the material deposited on the substrate surface and second nozzle surface. In addition, in alternate embodiments, ionized physical vapor deposition can be combined with other deposition techniques, for example, electroless deposition, electroplating, or atomic layer deposition. For example, ionized physical vapor deposition can be utilized to form a thin conductive layer and then electroplating or electroless deposition can be utilized to build up that layer to form protective layer 240. Another example would utilize electroless deposition or atomic layer deposition to form a thin seed layer and then electroplating or electroless deposition can be utilized to build up that layer to form protective layer 240. The latter techniques can be utilized to grow a thicker conformal protective layer 240 and subsequently tantalum or other suitable material may be deposited using low bias ionized sputtering to coat the bottom of fluid ejection chamber 208 in order to form an appropriate thickness to interface with the fluid. In addition, these techniques and processes may also be utilized in an alternate embodiment as described above, where fluid ejector generator 206 is omitted and fluid ejection chamber 208 is a chamber or fluidic channel.

Figure 4:
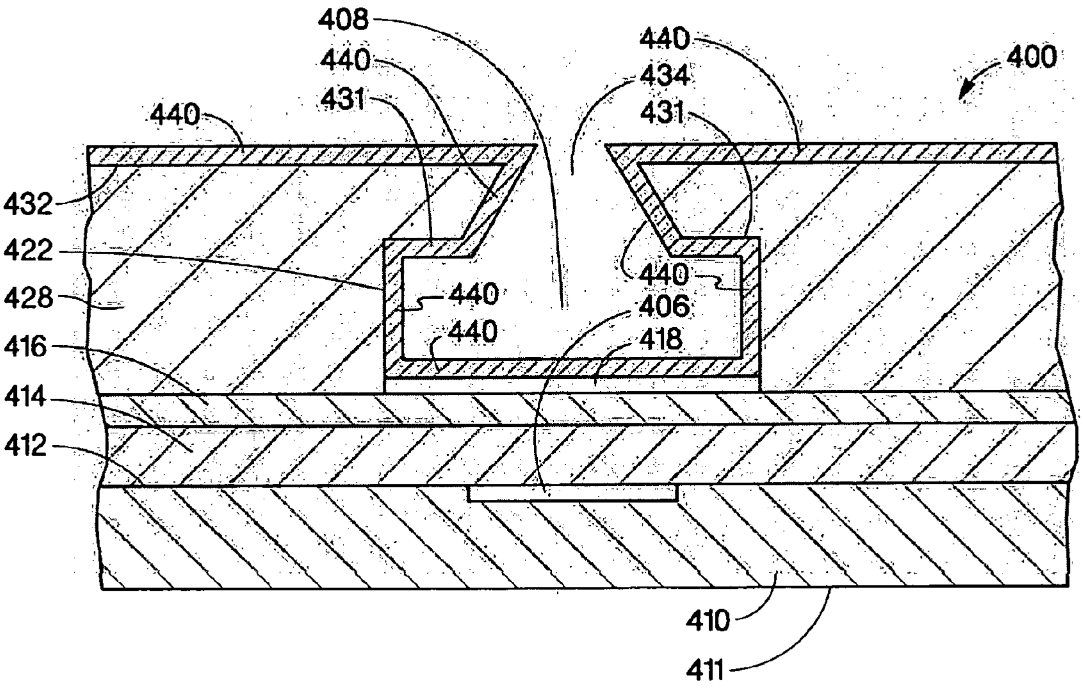
FIG. 4 is a cross-sectional view of a fluid ejector head according to an embodiment of the present invention.

Referring to FIG. 4 an exemplary embodiment of the present invention is shown where chamber nozzle layer 428 is formed as a single layer. In this embodiment, substrate 410 is a silicon wafer having a thickness of about 300-700 micrometers. Using conventional semiconductor processing equipment, known to those skilled in the art, transistors (not shown) as well as other logic devices required for fluid ejector head 400 are formed on substrate 410. Those skilled in the art will appreciate that the transistors and other logic devices can be realized as a stack of thin film layers. The particular structure of the transistors is not relevant to the invention, however some type of solid-state electronic device is present in this embodiment, such as, metal oxide field effect transistors (MOSFET), bipolar junction transistors (BJT). As described earlier other substrate materials can also be utilized. Accordingly these substrate materials will include one or more of the available semiconductor materials and technologies well known in the art, such as thin-film-transistor (TFT) technology using polysilicon on glass substrates.

Fluid ejector generator 406 is disposed on substrate 410. Silicon nitride layer 414 is disposed over substrate surface 412 of substrate 410 and fluid ejector generator 406. Silicon carbide layer 416 is disposed over silicon nitride layer 414. Tantalum layer 418 is disposed over a portion of silicon carbide layer 416. In alternate embodiments, other materials such as metals and ceramics may be utilized for tantalum layer 418. In this embodiment a high bias power redistribution cycle as described above may be utilized to sputter tantalum from tantalum layer 418 onto sidewalls 422 to form protective layer 440. A low bias power cycle may then be utilized to build up or re-shape the bottom of fluid ejection chamber 408. In an alternate embodiment, tantalum layer 418 may be omitted and tantalum is deposited through bore 434 on silicon carbide layer 416, utilizing a low bias deposition cycle.

Chamber nozzle layer 428 is disposed over silicon carbide layer 416 wherein sidewalls 422 form a portion of fluid ejection chamber 408. Chamber nozzle layer 428 contains one or more bores or nozzles 434 through which fluid is ejected. In addition, chamber nozzle layer 428 contains first nozzle surface 431 in the region substantially covering fluid ejection chamber 408. Chamber nozzle layer 428 also includes second nozzle surface 432. Bore 434 extends from first nozzle surface 431 to second nozzle surface 432.

FIG. 4 shows sidewalls 422, first nozzle surface 431, and tantalum layer 418 form fluid ejection chamber 408. In this embodiment, protective layer 440 coats sidewalls 422, tantalum layer 418, first nozzle surface 431, the surface of bore 434 and second nozzle surface 432. In alternate embodiments, protective layer 440 may not coat all surfaces depending on the particular material utilized for chamber nozzle layer 428, as well as the particular application in which fluid ejector 400 is utilized. In addition, the thickness of protective layer 440 may also vary depending on the particular material utilized for chamber nozzle layer 428 utilized, as well as the particular application in which fluid ejector 400 is utilized. In this embodiment, protective layer 440 has a thickness in the range from about 0.01 micrometer to about 1.25 micrometers. In addition, the thickness of protective layer 440 may vary from one portion of the layer to another. For example the thickness on sidewalls 422 may be about 0.05 micrometers, on the bottom of the fluid ejection chamber 408 protective layer 440 may be about 0.3 micrometers thick, and on second nozzle surface 432 it may be about 1.25 micrometers. Protective layer 440 may serve as a protective topcoat over nozzle layer 430. Protective layer 440 may be formed of the various materials described earlier.

In this embodiment, chamber nozzle layer 428 is a photoimagable epoxy available from MicroChem Corp. sold under the name Nano SU-8. Other materials may also be utilized such as photoimagable polyimides, other photoimagable epoxies, or benzocyclobutenes to name a few. In this embodiment fluid channels are formed through substrate 410, silicon nitride layer 414, and silicon carbide layer 416 for each fluid ejector generator 406 providing fluid channels from substrate bottom 411 through to fluid ejection chamber 408. In alternate embodiments, fluid channels, for example, may be formed from the edge of substrate 410 or via a slot formed in substrate 410. For clarity the fluid channels have been omitted from the FIG. 4. This embodiment, utilizing an integrated chamber nozzle layer is also applicable to the alternate embodiment described earlier in FIGS. 1 and 2, where the fluid ejector generator is omitted and the fluid ejection chamber is a chamber or fluidic channel.

Figure 5:
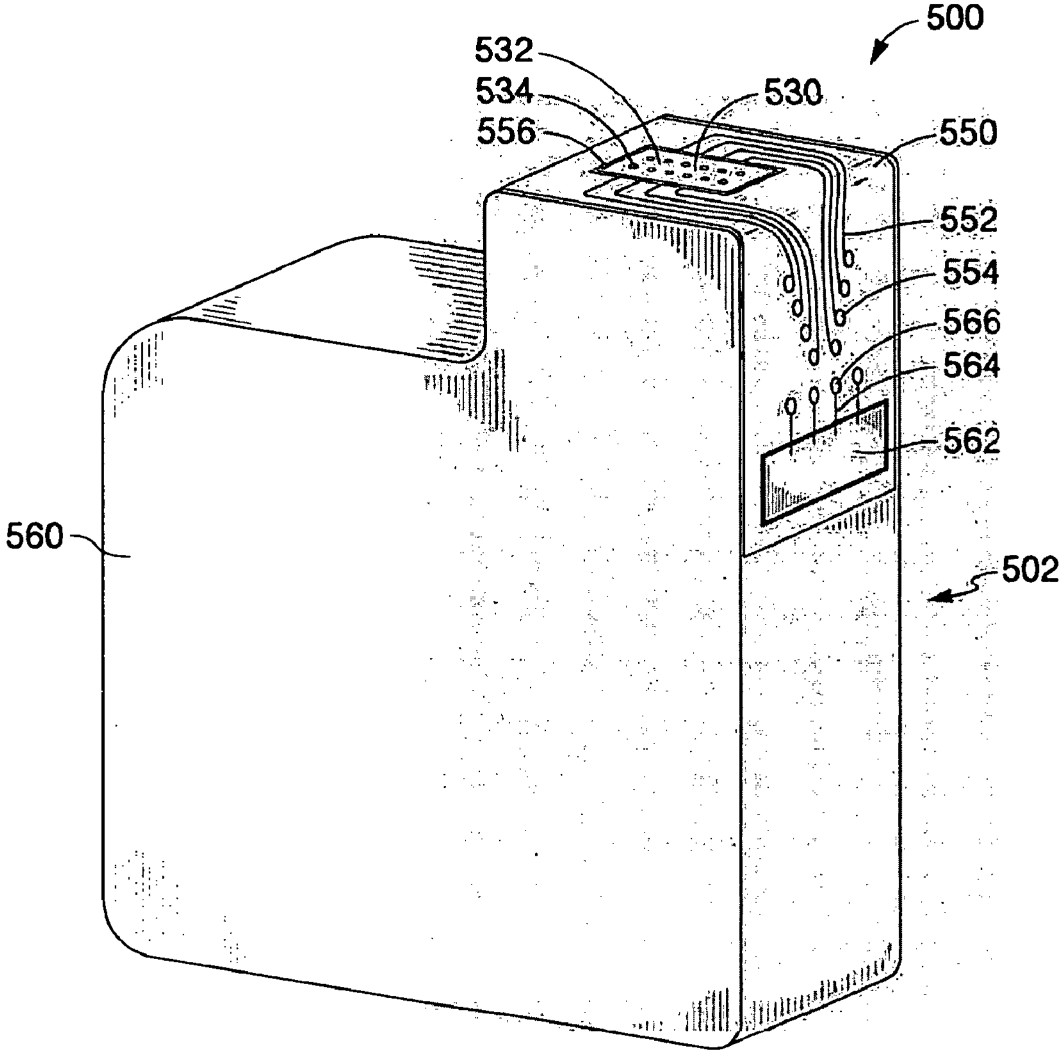
FIG. 5 is a perspective view of a fluid ejection cartridge according to an embodiment of the present invention.

Referring to FIG. 5, an exemplary embodiment of a fluid ejection cartridge 502 of the present invention is shown in a perspective view. In this embodiment, fluid ejection cartridge 502 includes reservoir 560 that contains a fluid, which is supplied to a substrate fluid ejector generators (not shown) and fluid ejection chamber (not shown). Second nozzle surface 532 of nozzle layer 530 contains one or more nozzles 534 through which fluid is ejected. Fluid ejector head 500 can be any of the fluid ejector heads described above.

Flexible circuit 550 of the exemplary embodiment is a polymer film and includes electrical traces 552 connected to electrical contacts 554. Electrical traces 552 are routed from electrical contacts 554 to electrical connectors or bond pads on the substrate (not shown) to provide electrical connection for the fluid ejection cartridge 502. Encapsulation beads 556 are dispensed along the edge of second nozzle surface 532 and the edge of the substrate enclosing the end portion of electrical traces 552 and the bond pads on the substrate. In an alternate embodiment an integrated nozzle layer and flexible circuit are utilized.

Information storage element 562 is disposed on fluid ejection cartridge 502 as shown in FIG. 5. Preferably, information storage element 562 is electrically coupled to flexible circuit 550. Information storage element 562 is any type of memory device suitable for storing and outputting information that may be related to properties or parameters of the fluid or fluid ejector head 500. In this embodiment, information storage element 562 is a memory chip mounted to flexible circuit 550 and electrically coupled through storage electrical traces 564 to storage electrical contacts 566. Alternatively, information storage element 562 can be encapsulated in its own package with corresponding separate electrical traces and contacts. When fluid ejection cartridge 502 is either inserted into, or utilized in, a fluid dispensing system information storage element 562 is electrically coupled to a controller (not shown) that communicates with information storage element 562 to use the information or parameters stored therein. However, other forms of information storage can also be utilized for the information storage element 562, such as a bar code or other device that allows storage of information.

Figure 6:
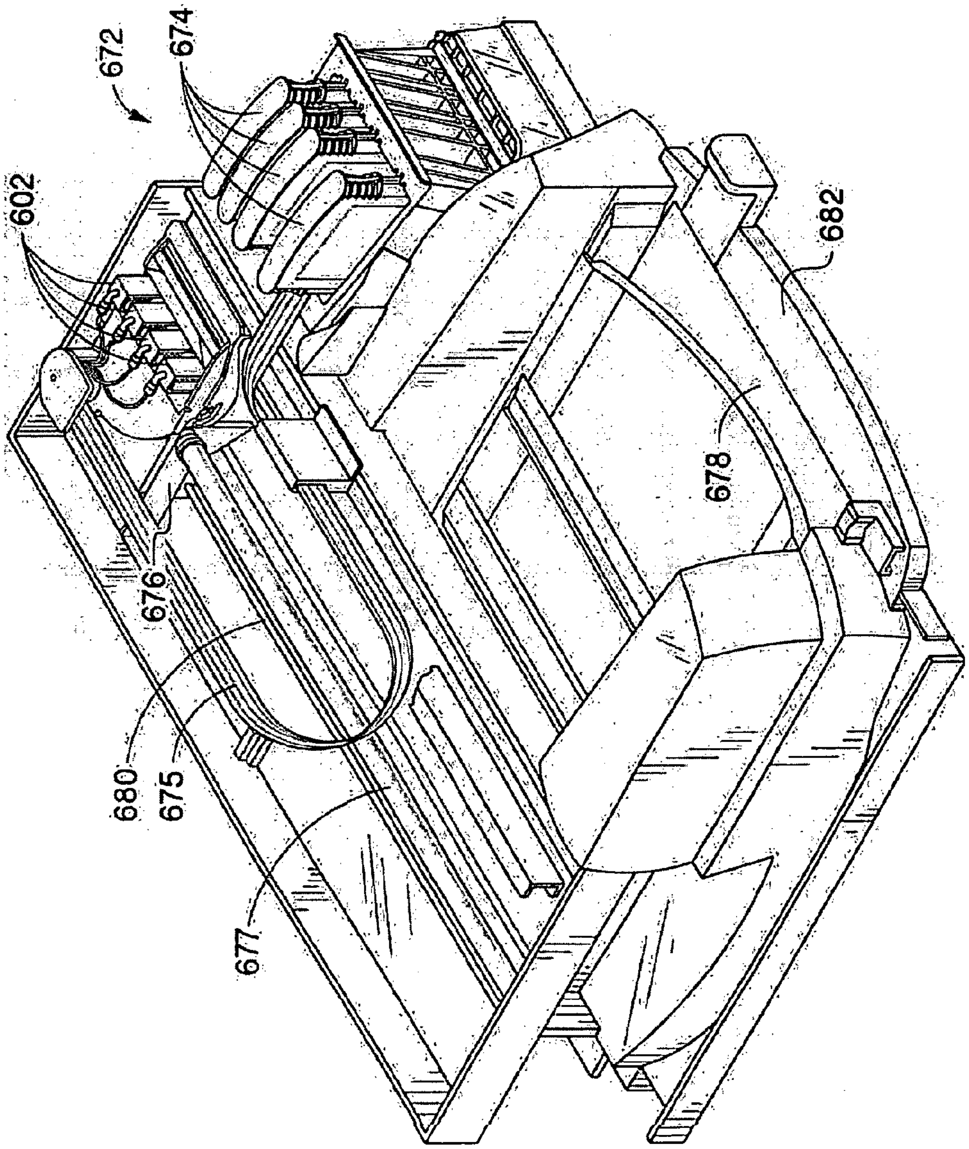
FIG. 6 is a perspective view of a fluid ejection system according to an embodiment of the present invention.

Referring to FIG. 6, a perspective view is shown of an exemplary embodiment of a fluid ejection system of the present invention. As shown fluid ejection system 670 includes fluid or ink supply 672, including one or more secondary fluid or ink reservoirs 674, commonly referred to as fluid or ink cartridges, that provide fluid to one or more fluid ejection cartridges 602. Fluid ejection cartridges 602 are similar to fluid ejection cartridge 502, however, other fluid ejection cartridges may also be utilized. Secondary fluid reservoirs 674 are fluidically coupled to fluid ejection cartridges via flexible conduit 675. Fluid ejection cartridges 602 may be semi-permanently or removably mounted to carriage 676. Fluid ejection cartridges 602 are electrically coupled to a drop firing controller (not shown) and provide the signals for activating the fluid ejector generators on the fluid ejection cartridges. In this embodiment, a platen or sheet advancer (not shown) to which fluid receiving or print medium 678, such as paper or an ingestible sheet, is transported by mechanisms that are known in the art. Carriage 676 is typically supported by slide bar 677 or similar mechanism within fluid ejection system 670 and physically propelled along slide bar 677 to allow carriage 676 to be translationally reciprocated or scanned back and forth across fluid receiving medium 678. Fluid ejection system 680 may also employ coded strip 680, which may be optically detected by a photodetector (not shown) in carriage 676 for precise positioning of the carriage. Carriage 676 may be translated, preferably, using a stepper motor (not shown), however other drive mechanism may also be utilized. In addition, the motor may be connected to carriage 676 by a drive belt, screw drive, or other suitable mechanism.

When a printing operation is initiated, print medium 678 in tray 682 is fed into a printing area (not shown) of fluid ejection system 680. Once print medium 678 is properly positioned, carriage 676 may traverse print medium 678 such that one or more fluid ejection cartridges 602 may eject ink onto print medium 678 in the proper position on various portions of fluid receiving medium 678. Receiving medium 678 may then be moved incrementally, so that carriage 676 may again traverse receiving medium 678, allowing the one or more fluid ejection cartridges 602 to eject ink onto a new position or portion that is non-overlapping with the first portion on print medium 678. Typically, the drops are ejected to form predetermined dot matrix patterns, forming for example images or alphanumeric characters.

Rasterization of the data can occur in a host computer such as a personal computer or PC (not shown) prior to the rasterized data being sent, along with the system control commands, to the system, although other system configurations or system architectures for the rasterization of data are possible. This operation is under control of system driver software resident in the system's computer. The system interprets the commands and rasterized data to determine which drop ejectors to fire. Thus, when a swath of ink deposited onto print medium 678 has been completed, print medium 678 is moved an appropriate distance, in preparation for the next swath. In this manner a two dimensional array of fluid ejected onto a receiving medium may be obtained. This invention is also applicable to fluid dispensing systems employing alternative means of imparting relative motion between the fluid ejection cartridges and the print media, such as those that have fixed fluid ejection cartridges and move the print media in one or more directions, and those that have fixed print media and move the fluid ejection cartridges in one or more directions.

Figure 7:
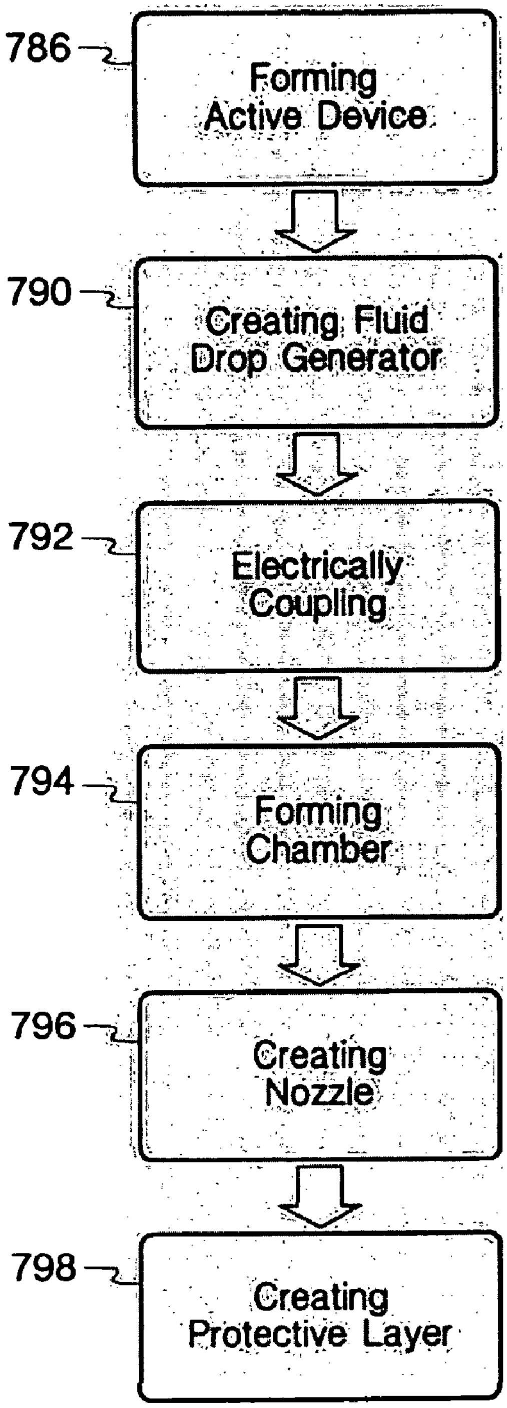
FIG. 7 is a flow diagram of a method of manufacturing a fluid ejector head according to an embodiment of this invention.

Referring to FIG. 7 a flow diagram of a method of manufacturing a fluid ejector head according to an embodiment of the present invention is shown. The process of forming active devices 786 utilizes conventional semiconductor processing equipment, to form transistors as well as other logic devices required for the operation of the fluid ejector head are formed in the substrate. Those skilled in the art will appreciate that the transistors and other logic devices typically are formed as a stack of thin film layers. The particular structure of the transistors is not relevant to the invention, various types of solid-state electronic devices can be utilized, such as, metal oxide field effect transistors (MOSFET), bipolar junction transistors (BJT).

The process of creating the fluid drop generator 790, typically a resistor formed as a tantalum aluminum alloy utilizes conventional semiconductor processing equipment, such as sputter deposition systems for forming the resistor and etching and photolithography systems for defining the location and shape of the resistor layer. In alternate embodiments, resistor alloys such as tungsten silicon nitride, or polysilicon may also be utilized. In other alternative embodiments, fluid drop generators other than thermal resistors, such as piezoelectric, or ultrasonic may also be utilized. The active devices are electrically coupled 792 to the fluid drop generators by electrical traces formed from aluminum alloys such aluminum copper silicon commonly used in integrated circuit technology. Other interconnect alloys may also be utilized such as gold, or copper.

The process of forming the fluid ejection chamber 794, or for other applications a chamber, depends on the particular material chosen to form the chamber layer or the chamber orifice layer when an integrated chamber layer and nozzle layer is used. The particular material chosen will depend on parameters such as the fluid being ejected, the expected lifetime of the printhead, the dimensions of the fluid ejection chamber and fluidic feed channels among others. Generally, conventional photoresist and photolithography processing equipment is used or conventional circuit board processing equipment is utilized. For example, the processes used to form a photoimagable polyimide chamber layer would be spin coating, soft bake, expose, develop, and subsequently a final bake process. However, forming a chamber layer, from what is generally referred to as a solder mask, would typically utilize a lamination process to adhere the material to the substrate. The remaining steps would be those typically utilized in photolithography. Other materials such as silicon oxide or silicon nitride may also be utilized, using deposition tools such as sputtering or chemical vapor deposition and photolithography tools for patterning. Still other embodiments may also utilize a technique similar to what is commonly referred to as a lost wax process. In this process, typically a lost wax material that can be removed, through, for example, solubility, etching, heat, photochemical reaction, or other appropriate means, is used to form the fluidic chamber and fluidic channels structures as well as the orifice or bore. Typically, a polymeric material is coated over these structures formed by the lost wax material. The lost wax material is removed by one or a combination of the above-mentioned processes leaving a fluidic chamber, fluidic channel and orifice formed in the coated material.

The process of creating the nozzle or bore 796 depends on the particular material chosen to form the nozzle layer. The particular material chosen will depend on parameters such as the fluid being ejected, the expected lifetime of the printhead, the dimensions of the bore, bore shape and bore wall structure among others. Generally, laser ablation may be utilized; however, other techniques such as punching, chemical milling, or micromolding may also be used. The method used to attach the nozzle layer to the chamber layer also depends on the particular materials chosen for the nozzle layer and chamber layer. Generally, the nozzle layer is attached or affixed to the chamber layer using either an adhesive layer sandwiched between the chamber layer and nozzle layer, or by laminating the nozzle layer to the chamber layer with or without an adhesive layer.

As described above (see FIG. 4) some embodiments will utilize an integrated chamber and nozzle layer structure referred to as a chamber orifice or chamber nozzle layer. This layer will generally use some combination of the processes already described depending on the particular material chosen for the integrated layer. For example, in one embodiment a film typically used for the nozzle layer may have both the nozzles and fluid ejection chamber formed within the layer by such techniques as laser ablation or chemical milling. Such a layer can then be secured to the substrate using an adhesive. In an alternate embodiment a photoimagable epoxy can be disposed on the substrate and then using conventional photolithography techniques the chamber layer and nozzles may be formed, for example, by multiple exposures before the developing cycle. In still another embodiment, a lost wax process can be utilized to form an integrated chamber layer and nozzle layer structure.

The process of creating the protective layer 798 depends on the particular material chosen to form the protective layer. The particular material chosen will depend on parameters such as the material chosen to form the chamber layer, the fluid being ejected, and the expected lifetime of the printhead, among others. Generally, conventional ionized physical vapor deposition tools and processes will be utilized as described above. However, other techniques such as electroplating, electroless deposition, and atomic layer deposition may also be utilized separately or in combination with ionized physical vapor deposition where the protective layer is deposited through the nozzle or bore onto the sidewalls, substrate and bore surfaces as well as the first and second nozzle surfaces. Whether the protective layer is deposited on all or only a portion of the surfaces will depend on the particular application in which the chamber or fluid ejection chamber will be utilized.

Although the exemplary embodiments of the present invention relate to fluid ejector heads and fluid ejector cartridges, the present invention may be used for mixing chambers, reaction chambers utilizing both liquids as well as gases, and in other applications such as in micro-electromechanical devices.

While the present invention has been particularly shown and described with reference to the foregoing preferred and alternative embodiments, those skilled in the art will understand that many variations may be made therein without departing from the spirit and scope of the invention as defined in the following claims. This description of the invention should be understood to include all novel and non-obvious combinations of elements described herein, and claims may be presented in this or a later application to any novel and non-obvious combination of these elements. The foregoing embodiments are illustrative, and no single feature or element is essential to all possible combinations that may be claimed in this or a later application. Where the claims recite "a" or "a first" element of the equivalent thereof, such claims should be understood to include incorporation of one or more such elements, neither requiring no excluding two or more such elements.

What is claimed is:

1. A method of manufacturing a fluid ejector head comprising:

defining side walls of at least one fluid ejection chamber about at least one fluid drop generator disposed over a substrate;

creating at least one bore over said at least one fluid ejection chamber, said at least one bore having a first nozzle surface proximate to said at least one fluid ejection chamber and a second nozzle surface distal to said at least one fluid ejection chamber; and sputter depositing an initial deposit of a protective layer material at a low substrate bias voltage through said at least one bore; and redistributing a portion of said initial deposit of the protective layer material on said side walls at a high substrate bias voltage, wherein an inorganic protective layer is formed on said side walls of said at least one fluid ejection chamber and on a portion of said first nozzle surface.

2. A method in accordance with the method of claim 1, wherein said sputter depositing the initial deposit includes sputter depositing the initial deposit of said protective layer material onto a portion of a bottom surface of said at least one fluid ejection chamber.

3. A method in accordance with the method of claim 1, wherein said protective layer material comprises a tantalum metal.

4. A method in accordance with the method of claim 1, wherein said protective material is selected from the group consisting of an oxide, a nitride, a boride, a carbide, a metal and mixtures thereof.

5. A method of manufacturing a fluid ejector head comprising:

defining side walls of at least one fluid ejection chamber about at least one fluid drop generator;

creating a nozzle layer over said at least one fluid ejection chamber, said nozzle layer having at least one bore formed therein and a first nozzle surface proximate to said at least one fluid ejection chamber; and sputter depositing an initial deposit of a protective layer material at a low substrate bias voltage; and redistributing a portion of said initial deposit of the protective layer material on said side walls at a high substrate bias voltage, wherein an inorganic protective layer is formed on said side walls of said at least one fluid ejection chamber, on a surface of said at least one bore of said nozzle layer, and on a portion of said first nozzle surface.

6. A method of manufacturing a fluid ejector head comprising:

defining side walls of at least one fluid ejection chamber;

creating a bore having a surface over said at least one fluid ejection chamber, wherein a first bore surface proximate to said at least one fluid ejection chamber and a second bore surface distal to said at least one fluid ejection chamber;

sputter depositing an initial deposit of a protective layer material at a low substrate bias voltage; and redistributing a portion of said initial deposit of the protective layer material on said side walls at a high substrate bias voltage, wherein an inorganic protective layer is formed on said side walls of said at least one fluid ejection chamber, on the surface of said at least one bore, and on a portion of said first bore surface.

7. A method in accordance with the method of claim 6, wherein sputter depositing further comprises sputter depositing said protective layer utilizing multiple targets to form a multilayer inorganic protective layer.

* * * * *